US007352870B2

(12) United States Patent
Enamito et al.

(10) Patent No.: US 7,352,870 B2
(45) Date of Patent: Apr. 1, 2008

(54) ACTIVE SOUND MUFFLER AND ACTIVE SOUND MUFFLING METHOD

(75) Inventors: Akihiko Enamito, Kawasaki (JP); Osamu Nishimura, Kawasaki (JP); Tsutomu Shioyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 332 days.

(21) Appl. No.: 10/400,564

(22) Filed: Mar. 28, 2003

(65) Prior Publication Data

US 2003/0231780 A1 Dec. 18, 2003

(30) Foreign Application Priority Data

Mar. 29, 2002 (JP) ............................ 2002-097649

(51) Int. Cl.
*H03B 29/00* (2006.01)
*H04B 15/00* (2006.01)
*F01N 1/06* (2006.01)

(52) U.S. Cl. ................... 381/71.2; 381/71.7; 381/71.1; 381/71.8; 381/94.1; 381/73.1; 181/206; 181/289

(58) Field of Classification Search ............... 381/71.1, 381/71.2, 94.1, 94.9, 71.7, 73.1, 71.8; 181/206, 181/289, 286
See application file for complete search history.

(56) References Cited

U.S. PATENT DOCUMENTS 5,024,288 A * 6/1991 Shepherd et al. ........... 181/206
5,724,432 A * 3/1998 Bouvet et al. ............. 381/71.1
5,872,853 A * 2/1999 Marquiss ................... 381/71.1
6,078,673 A * 6/2000 von Flotow et al. ....... 381/71.7
6,463,156 B1 * 10/2002 Gaudriot et al. ........... 381/71.1
6,483,926 B1 * 11/2002 Yamashita et al. ......... 381/71.7
2001/0046303 A1 * 11/2001 Ohnishi et al. ............ 381/71.7

FOREIGN PATENT DOCUMENTS

| | | |
|---|---|---|
| EP | 1 148 470 | 10/2001 |
| JP | 7-234689 | 9/1995 |
| JP | 7-281674 | 10/1995 |
| JP | 9-54593 | 2/1997 |
| JP | 10-268873 | 10/1998 |
| JP | 2001-172925 | 6/2001 |

OTHER PUBLICATIONS

A. Omoto, et al., "Active Canceling of Edge Potential of Noise Barrier", Japan Acoustica Soc., 47, 11, 1991, pp. 801-808.

* cited by examiner

*Primary Examiner*—Vivian Chin
*Assistant Examiner*—Devona E Faulk
(74) *Attorney, Agent, or Firm*—Oblon, Spivak, McClelland, Maier & Neustadt, P.C.

(57) ABSTRACT

An active sound muffler for reducing a sound to be reduced as emitted from a sound source located at one of the opposite sides of a sound insulating wall and diffracted and transmitted to the other side, the muffler comprises a control loudspeaker arranged at the front end or the other side of the sound insulating wall and adapted to output a control sound with a predetermined amplitude and a predetermined phase, a control microphone arranged above the sound insulating wall and adapted to gauge the sound pressure or the acoustic intensity of the sound to be reduced and that of the control sound and a control circuit for controlling the output of the control loudspeaker so as to minimize the sound pressure or the acoustic intensity, whichever appropriate, based on the outcome of gauging of the control microphone, and the control loudspeaker showing a line sound source characteristic.

12 Claims, 7 Drawing Sheets

FIG. 1
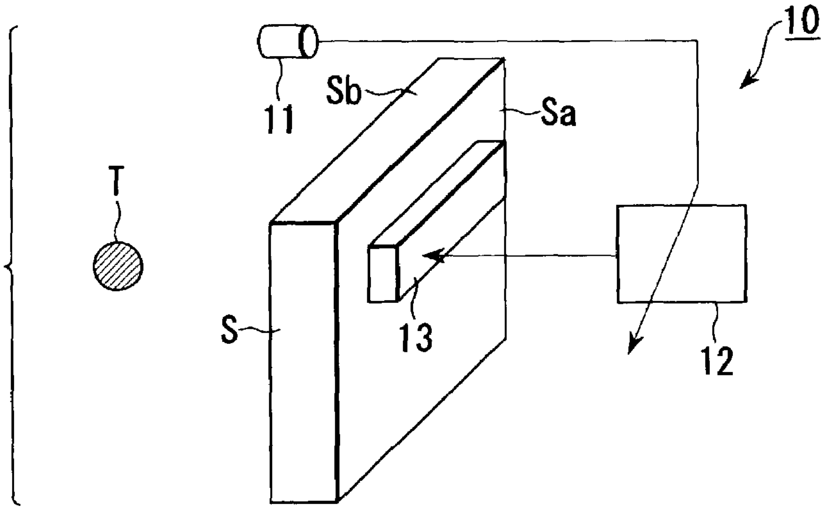
FIG. 2A
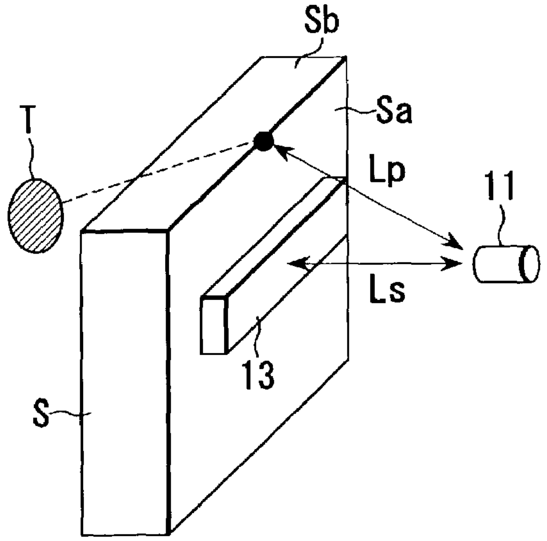
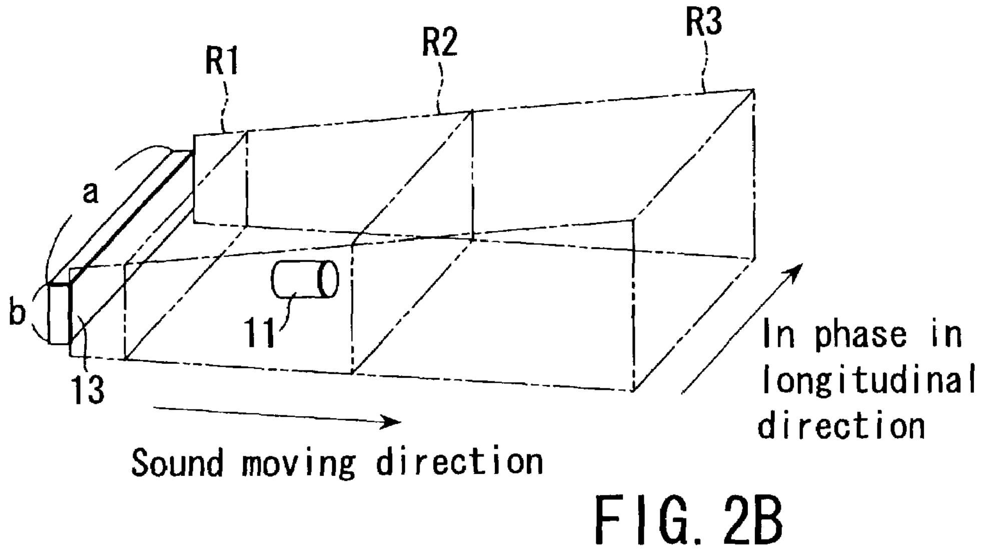
FIG. 2B

Wall height

Lb=sound muffling effect at 3m point

ACTIVE SOUND MUFFLER AND ACTIVE SOUND MUFFLING METHOD

CROSS-REFERENCE TO RELATED APPLICATIONS

This application is based upon and claims the benefit of priority from the prior Japanese Patent Application No. 2002-097649, filed Mar. 29, 2002, the entire contents of which are incorporated herein by reference.

BACKGROUND OF THE INVENTION

1. Field of the Invention

This invention relates to an active sound muffler for reducing noises that are diffracted to propagate by a sound insulating wall. More particularly, this invention relates to an active sound muffler that is effective for noises in which low frequency sounds are dominant.

2. Description of the Related Art

Sound insulating walls are built along certain trunk roads loaded with heavy traffic. The known noise reducing techniques using sound insulating walls are apparently classified into two categories. One is to insulate sounds simply by building a tall sound insulating wall along a road in order to block noises. The other is to provide a noise reducing device at the top end of the sound insulating wall built along the road in order to reduce propagating noises without making the wall very high.

The techniques utilizing a sound reducing device are further divided into passive techniques and active techniques from the viewpoint of the underlying principle adopted for noise reduction. Passive techniques include the use of branching type sound insulating walls that utilize interference of sounds, glass wool cylinders, sound absorbing cylindrical edges formed by using a 20 μm thick PVF film, a perforated aluminum plate and a stainless steel grill and soft edges adapted to produce an acoustically soft surface by using an acoustic pipe that is designed optimally based on the wavelengths of noises that may be involved. These techniques are effective for medium and high pitch sounds.

On the other hand, active techniques include electrically producing a soft surface (zero sound pressure) for active sound control using loudspeakers and microphones without changing the length of the acoustic pipe. This technique is effective for low pitch sounds.

A loudspeaker used for such an active technique can be approximated to a point sound source. Generally, a popular cone type loudspeaker showing radiation characteristics of a spherical wave is used.

Known active sound mufflers using loudspeakers operating as point sound sources are accompanied by a problem as described below. The diffracted sounds are not necessarily in phase with each other in the longitudinal direction (along the road) at the top end of the sound insulating wall. Particularly, road noises that sound insulating walls are required to deal with are low frequency noises showing a frequency band as wide as hundreds of several Hz. Therefore, if the sound insulating wall has a length exceeding 1 m, it also exceeds a half wavelength of road noises and hence, generally speaking, diffracted sounds are, if partly, out of phase with each other.

This problem may be avoided by partitioning the space at the top end of the sound insulating wall so that diffracted sounds may become in phase with each other along the surface to be controlled in a sound field where they are originally out of phase in the longitudinal direction and arranging a control loudspeaker for the surface where diffracted sounds are made in phase with each other. However, if noises that are to be reduced have a frequency of 500 Hz, the space needs to be partitioned at least by every 34 cm. Then, as many control loudspeakers and microphones as the number of divisional spaces need to be installed. If, on the other hand, control loudspeakers are arranged simply for every half wavelength to control noises. There can be produced regions where sounds are boosted because the acoustic energy of diffracted sounds is not minimized at the top end of the sound insulating wall, although the sound pressure may be reduced at the positions of the control microphones.

BRIEF SUMMARY OF THE INVENTION

An object of the invention is to provide an active sound muffler that can reduce diffracted sounds by means of a relatively simple control arrangement if diffracted sounds are out of phase in the longitudinal direction of a sound insulating wall.

The present invention may provide an active sound muffler for reducing a sound to be reduced as emitted from a sound source located at one of the opposite sides of a sound insulating wall and diffracted and transmitted to the other side, the muffler comprising:

An additional sound source arranged at the top end or the other side of the sound insulating wall and adapted to output a control sound with a predetermined amplitude and a predetermined phase;

a sound source gauging device arranged above the sound insulating wall and adapted to gauge the sound pressure or the acoustic intensity of the sound to be reduced and that of the control sound; and an additional sound source control means for controlling the output of the additional sound source so as to minimize the sound pressure or the acoustic intensity, whichever appropriate, based on the outcome of gauging of the sound source gauging device;

the additional sound source showing a line sound source characteristic.

BRIEF DESCRIPTION OF THE SEVERAL VIEWS OF THE DRAWING

FIG. 1 is an illustration showing the configuration of the first embodiment of active sound muffler according to the invention;

FIGS. 2A and 2B are illustrations showing the control principle of the control loudspeaker of the first embodiment;

DETAILED DESCRIPTION OF THE INVENTION

Figure 3:
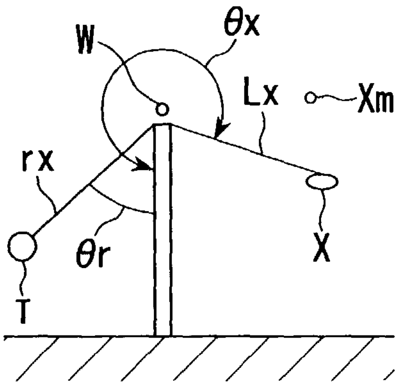
FIG. 3 is an illustration showing the principle of computing the effect of reducing a diffracted sound.

FIG. 1 is an illustration showing the configuration of the first embodiment of active sound muffler 10 according to the invention. FIGS. 2A and 2B are illustrations showing the control principle of the control loudspeaker 13 that is incorporated in the active sound muffler 10. In FIG. 1, reference symbol T denotes a noise source and reference symbol S denotes a sound insulating wall. The noise source T may be a vehicle that may typically be a sedan. The sound insulating wall S is arranged near a road (not shown) on which the vehicle, or the noise source, passes in order to separate the road side and the side where sounds are to be muffled. The longitudinal direction of the wall S is arranged along the road.

The active sound muffler 10 comprises a control microphone (sound source gauging device) 11, a control circuit (additional sound source control means) 12 and a control loudspeaker (additional sound source) 13. The control microphone 11 is arranged above the sound insulating wall S at a given position, which will be described later, in order to detect the sound pressure or the acoustic intensity of diffracted sound. The control circuit 12 generates a sound with a phase inverse to that of the diffracted sound from a control loudspeaker 13, which will be described later, in order to minimize the signal detected by the control microphone 11 based on the output of the control microphone 11. The control loudspeaker 13 is fitted to the lateral surface Sa of the side where sounds are to be muffled of the sound insulating wall S. The operation of driving the control loudspeaker 13 is controlled by the control circuit 12. The control loudspeaker 13 may alternatively be fitted to the top surface Sb of the sound insulating wall S.

The control loudspeaker 13 is fitted to the lateral surface Sa or the top surface Sb of the sound insulating wall S because it is important to drive the loudspeaker to emit a sound in the direction in which diffracted sounds proceed. Therefore, it is preferable that the oscillating surface of the loudspeaker is directed upward or to the side where sounds are to be muffled of the sound insulating wall S. The control loudspeaker 13 may be arranged at a convenient position depending on the surrounding environment.

Sounds diffracted by the sound insulating wall S and the control sound emitted from the control loudspeaker 13 are input to the control microphone 11 as shown in FIG. 2A.

The control loudspeaker 13 shows the characteristic of a so-called line sound source. It has a contour of a rectangle with long edges of La (m) and short edges of Lb (m). The characteristic of a line sound source is such that the radiated sound wave propagates within a cylinder having a center axis that is identical with the line sound source and the intensity of sound at point in the cylinder is inversely proportional to the distance from the sound source to the point while the sound pressure level is attenuated by 3 dB when the distance is doubled.

The active sound muffler 10 having the above described configuration reduces noises in a manner as described below. From the viewpoint of road noises, a vehicle on a road can be regarded as a point sound source. However, a plurality of vehicles running one after another on the road can be regarded as a line sound source because they are running in a row.

The difference between a point sound source and a line sound source will be described. A point sound source is a sound source that is sufficiently small relative to the wavelength of the sound it generates so that its oscillation surface oscillates with the same and identical phase and hence it radiates a sound uniformly in all directions in a free space. In other words, the sound wave on the surface of a sphere centered at the sound source is uniform and hence the surface of the sound wave is spherical. Therefore, the sound wave is referred to as spherical wave.

If the acoustic output of a point sound source is P (W). The intensities P1 and P2 of sound on the surfaces of spheres centered at the point sound source and having respective radiuses of r1 and r2 are expressed respectively by $P/(4\pi r1^2)$ and $P/(4\pi r2^2)$. Here, π is the circular constant.

The difference of the sound pressure levels Lr1 and Lr2 at the radiuses of r1 and r2 is expressed by the following equation.

$$Lr1-Lr2=20\log(r2/r1) \quad (1)$$

It represents the attenuation due to divergence of the sound wave from a point sound source. It is equal to 6 dB when r2/r1=2 and 20 dB when r2/r1=10.

On the other hand, a line sound source may be a row of point sound sources that are tightly arranged to form a line or a linear duct that radiates sound. In a free space, the sound wave emitted from a line sound source diverges within a cylinder having a center axis that is identical with the line sound source. In other words, the sound wave on the surface of a sphere centered at the sound source is uniform and hence the surface of the sound wave is spherical. The surface areas per unit length of two cylindrical surfaces at respective distances r1 and r2 from the center axis are 2πr1 and 2πr2.

If the acoustic output radiated from a unit length of a line sound source is P, the intensities of sound P1 and P2 at the cylindrical surfaces are expressed respectively by P/(2πr1) and P/(2πr2). Then, the difference of the sound pressure levels Lr1 and Lr2 for r1 and r2 are expressed by the following equation.

$$Lr1-Lr2=10\log(r2/r1) \quad (2)$$

It is equal to about 3 dB when r2/r1=2 and about 10 dB when r2/r1=10.

When compared in terms of the area over which a sound spreads, the area over which the sound is radiated is quadrupled when the distance is doubled for a point sound source, whereas it is only doubled for a line sound source. In other words, a line sound source shows a relatively small degree of attenuation for radiated acoustic energy.

A sound radiated from a noise source T produces diffraction energy E at the top surface Sb when it is diffracted at a position above the sound insulating wall S. When the sound pressure or the acoustic intensity of the diffracted sound detected by the control microphone 11 is minimized by the control circuit 12, a sound is generated from the control loudspeaker 13 with an inverted phase. Since the control loudspeaker 13 is located close to the diffraction energy E, the diffraction energy E of the sound insulating wall S is minimized to make it possible to reduce the diffracted sound propagating to the side where sounds are to be muffled in the entire space of propagation.

The effect of reducing a diffracted sound of the above described arrangement will be discussed. FIG. 3 is an illustration showing the principle of computing the effect of reducing a diffracted sound. Referring to FIG. 3, if the noise source T is a line sound source (cylindrical sound source), the space transfer function H of a sound emitted from the sound source and diffracted at a position above the sound insulating wall S to get to a point X located at the other side of the sound insulating wall S is expressed as follows.

$$H(\theta_r, \theta_x, r, x) = \alpha_{H\beta}(\theta_r, \theta_x)F(r)G(x) \tag{3}$$

$$\alpha = \frac{e^{-j\frac{\pi}{4}}}{2\sqrt{2\pi k^2}},\ \beta = \frac{1}{\cos\left(\frac{\theta_r - \theta_x}{2}\right)} + \frac{1}{\cos\left(\frac{\theta_r + \theta_x}{2}\right)}$$

$$F(r_x) = \frac{1}{\sqrt{k}} \cdot \frac{e^{-jkr_x}}{\sqrt{r_x}} \tag{4}$$

$$G(x) = \frac{1}{\sqrt{k}} \cdot \frac{e^{-jkx}}{\sqrt{x}} \tag{5}$$

where α is a constant expressed in terms of number of waves k (2πf/c) and β is a variable that depends on the angle defined by the angle θr between the sound insulating wall S and the noise source T and the angle θx between the sound insulating wall S and the point X. F(rx) is the space transfer function from the noise source T to the top end of the sound insulating wall S that depends on the distance rx from the noise source T to the top end of the sound insulating wall S. G(X) is the space transfer function from the top end of the sound insulating wall S to the sound receiving point X that depends on the distance Lx from the top end of the sound insulating wall S to the sound receiving point X.

On the other hand, if the space transfer function from the control loudspeaker W arranged near the top end of the sound insulating wall S to the sound receiving point X is Gs(X). It depends on the distance Lx from the control loudspeaker W to the sound receiving point X and is expressed as follows.

$$G_S(x) = \frac{1}{\sqrt{k}} \cdot \frac{e^{-jkr_x}}{\sqrt{x}} \tag{6}$$

Therefore, if the noise source T and the control loudspeaker W are radiating respective sounds simultaneously with respective intensities of Qp and Qs, the sound pressure detected by the control microphone D arranged at point Xm at the other side is expressed as follows.

$$P_{xm} = \alpha \cdot \beta m \cdot F(rp) \cdot G(x_m) \cdot Q_P + G_S(x_m) \cdot Q_S \tag{7}$$

$$\alpha = \frac{e^{-j\frac{\pi}{4}}}{2\sqrt{2\pi k^2}},\ \beta m = \frac{1}{\cos\left(\frac{\theta_r - \theta_{xm}}{2}\right)} + \frac{1}{\cos\left(\frac{\theta_r + \theta_{xm}}{2}\right)}$$

Therefore, as the sound pressure level of the control microphone D is made lowest by means of the control circuit, the right side of the equation (5) substantially approaches to 0. Thus, the intensity Qs of sound of the control loudspeaker W is expressed as follows.

$$Q_S = \frac{\alpha \cdot \beta m \cdot F(rp) \cdot G(x_m) \cdot Q_P}{G_S(X_m)} \tag{8}$$

Then, the sound pressure Pxe observed at point Xe is expressed as follows.

$$\begin{aligned} P_{Xe} &= \alpha \cdot \beta_e \cdot F(rp) \cdot G(x_e) \cdot Q_P + G_S(x_e) \cdot Q_S \\ &= \alpha \cdot \beta e \cdot F(rp) \cdot G(x_e) \cdot Q_P - G_S(x_e) \cdot \frac{\alpha \cdot \beta m \cdot F(rp) \cdot G(x_m) Q_P}{G_S(x_m)} \end{aligned} \tag{9}$$

$$\beta e = \frac{1}{\cos\left(\frac{\theta_r - \theta_{xe}}{2}\right)} + \frac{1}{\cos\left(\frac{\theta_r + \theta_{xe}}{2}\right)}$$

Therefore, the reduction η of sound pressure observed at point Xe and expressed in terms of the difference between before and after the control is as follows.

$$\begin{aligned} \eta &= \frac{\alpha \cdot \beta e \cdot F(rp) \cdot G(x_m) \cdot Q_P + G_S(x_e) \cdot Q_S}{\alpha \cdot \beta e \cdot F(rp) \cdot G(x_e) \cdot Q_P} \\ &= 1 - \frac{1}{\alpha \cdot \beta e \cdot F(rp) \cdot G(x_e) Q_P} \cdot G_S(x_e) \cdot \frac{\alpha \cdot \beta m \cdot F(rp) \cdot G(x_m) \cdot Q_P}{G_S(X_m)} \\ &= 1 - \frac{\beta m \cdot G_S(x_e) \cdot G(x_m)}{\beta e \cdot G(x_e) \cdot G_S(x_m)} \end{aligned} \tag{10}$$

The reduction is expressed as follows in terms of decibel.

$$\eta = 10 \log\left(1 - \frac{\beta m \cdot G_S(x_e) \cdot G(x_m)}{\beta e \cdot G(x_e) \cdot G_S(x_m)}\right)(db) \tag{11}$$

Therefore, if the control loudspeaker W is arranged at the top end of the sound insulating wall S, the reduction is maximized and expressed by η=−∞.

Figure 4:
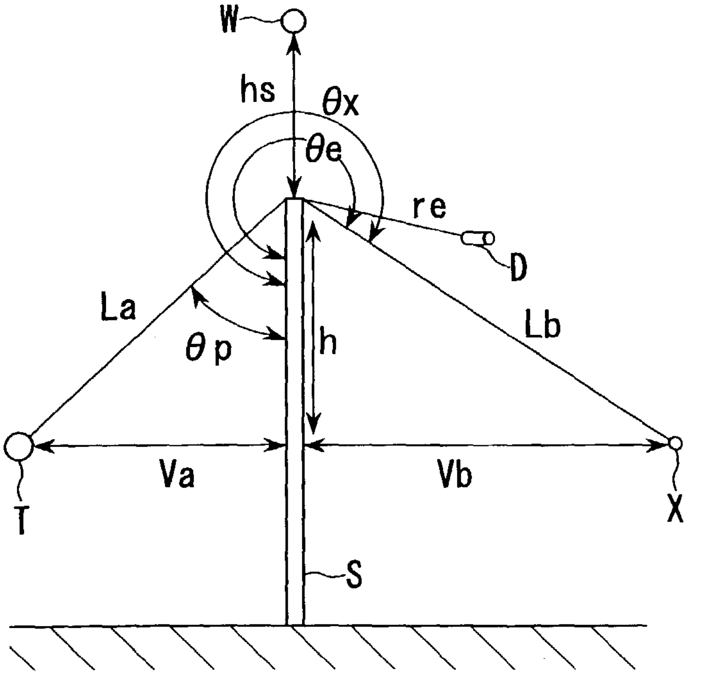
FIG. 4 is an illustration showing the principle of computing the effect of reducing a diffracted sound.

Based on the expression (11), the sound muffling effect of active noise control will be verified by way of numerical analysis. The reduction in the sound pressure observed at the sound receiving point X separated from the sound insulating wall S by distance Vb and defined by distance Lb from the top end of the wall S and angle θx from the sound insulating wall S as shown in FIG. 4 will be discussed by assuming that the noise source T is separated from the sound insulating wall S by distance Va and the distance and the angle between the top end of the sound insulating wall S and the noise source T are La and θp respectively, whereas the control loudspeaker W is arranged above the top end of the sound insulating wall S and separated from the latter by distance hs and the control microphone D is arranged in such a way that the distance and the angle between them are re and θe respectively.

Figure 5:
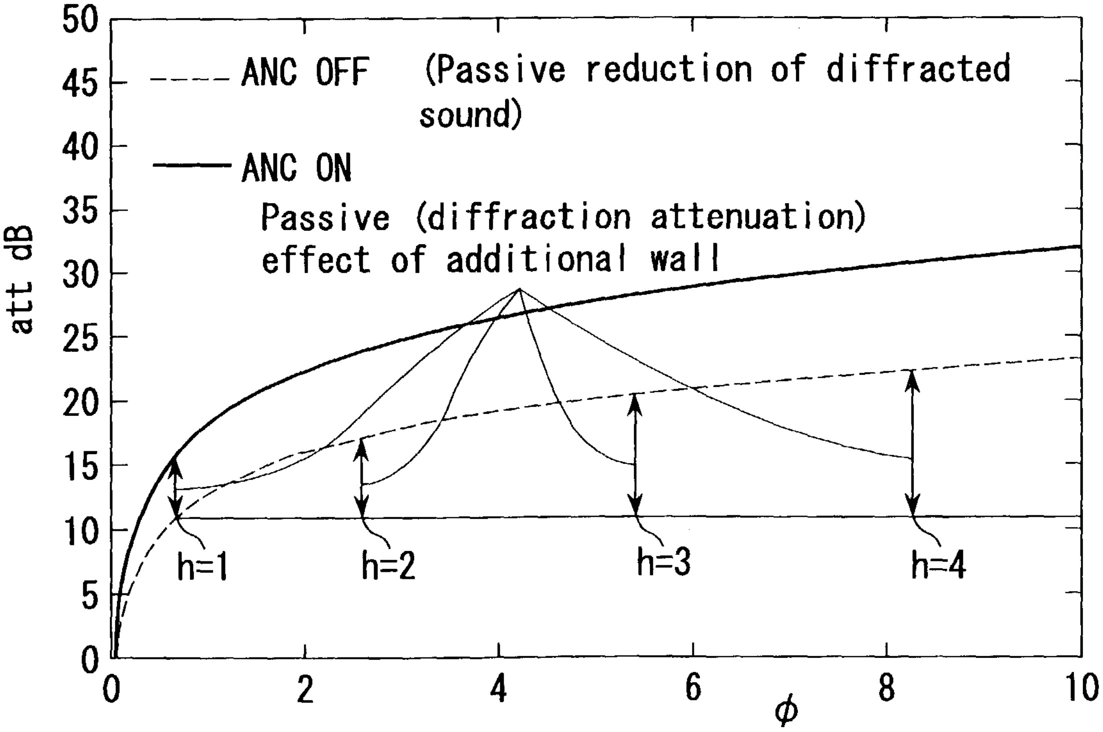
FIG. 5 is an illustration showing the difference in sound reduction between the presence and the absence of active noise control.
Figure 6B:
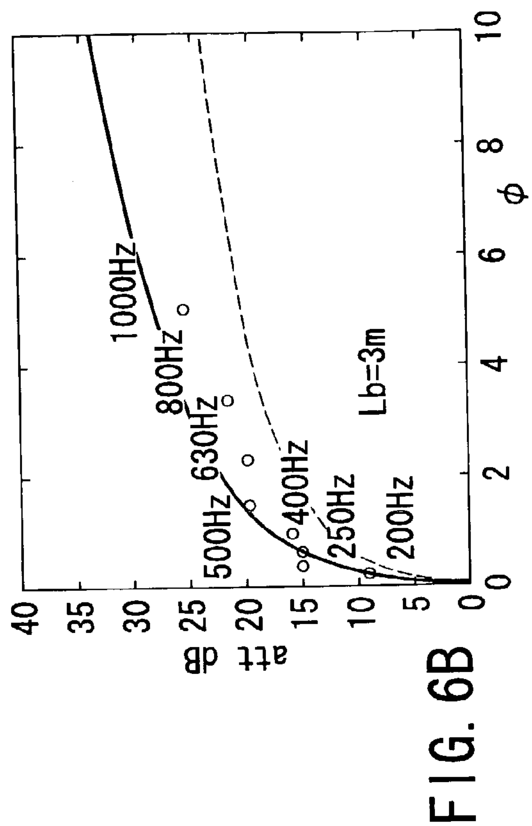
FIGS. 6A through 6D are illustrations showing the difference in sound reduction due to the position of the sound receiving point.
Figure 6D:
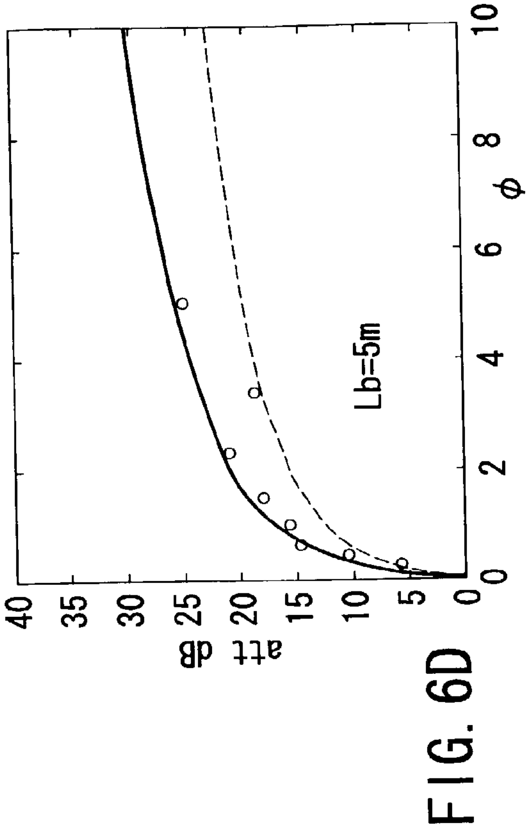
Figure 6A:
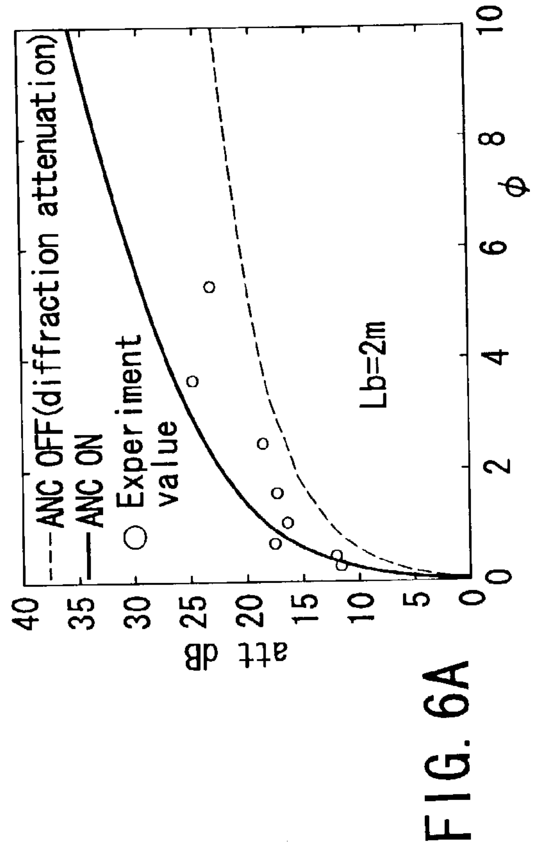
Figure 6C:
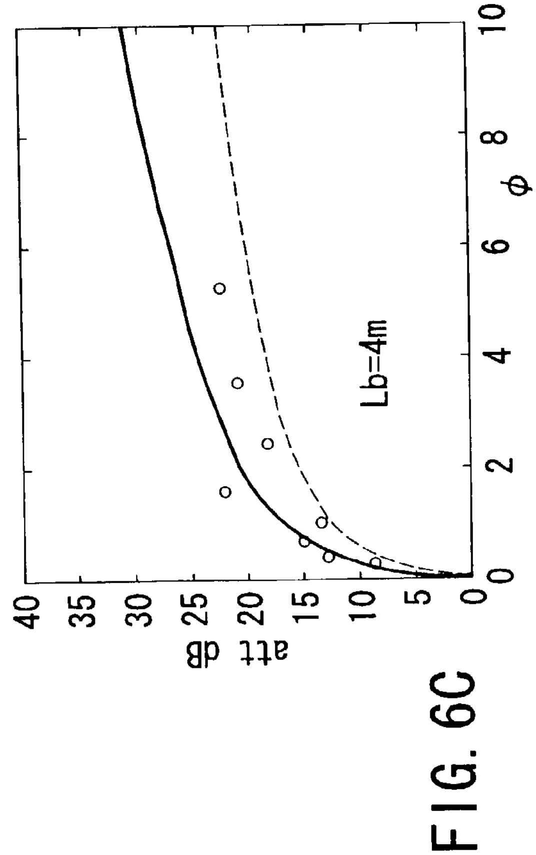
Figure 7A:
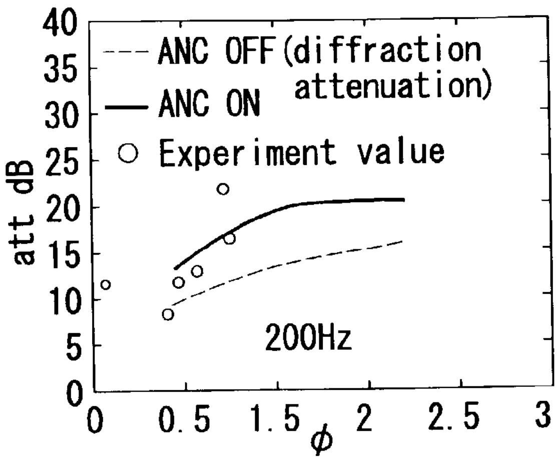
FIGS. 7A through 7H are illustrations showing the difference in sound reduction due to frequency.
Figure 7B:
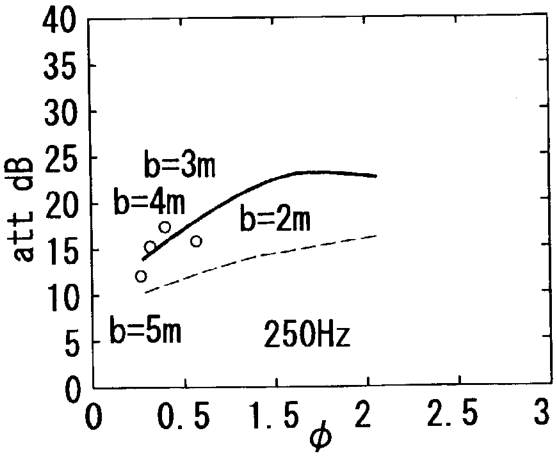
Figure 7C:
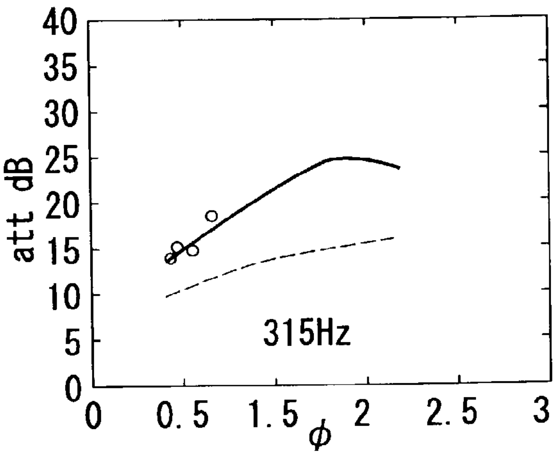
Figure 7D:
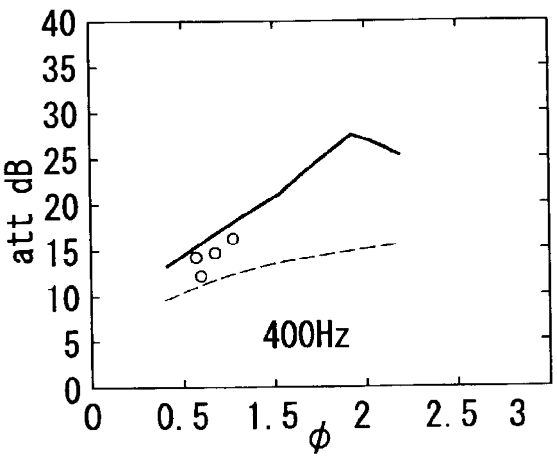
Figure 7E:
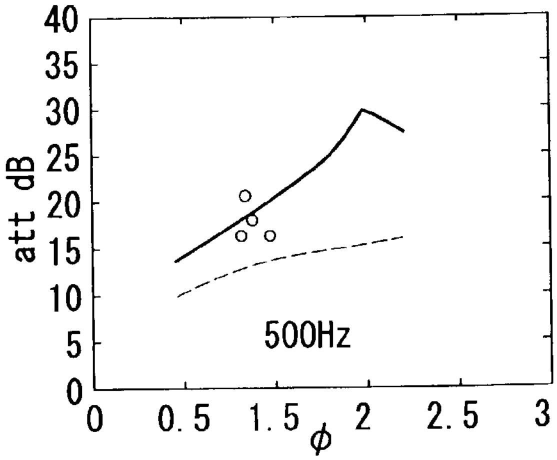
Figure 7F:
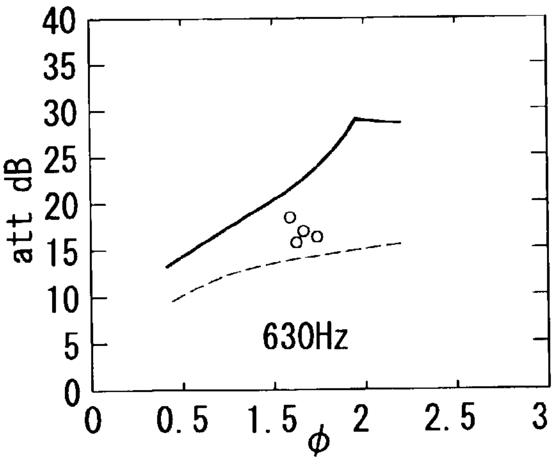
Figure 7G:
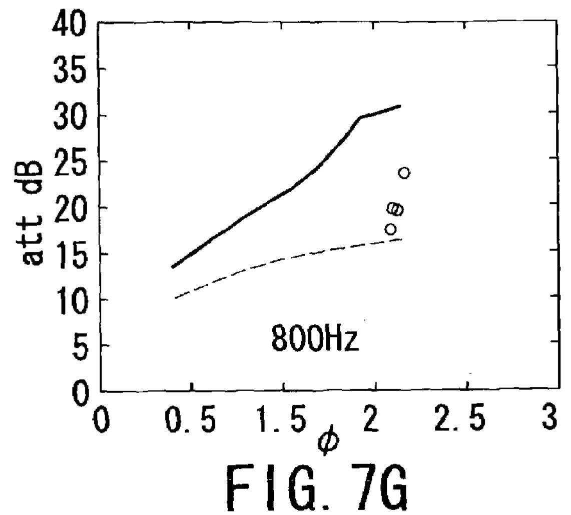
Figure 7H:
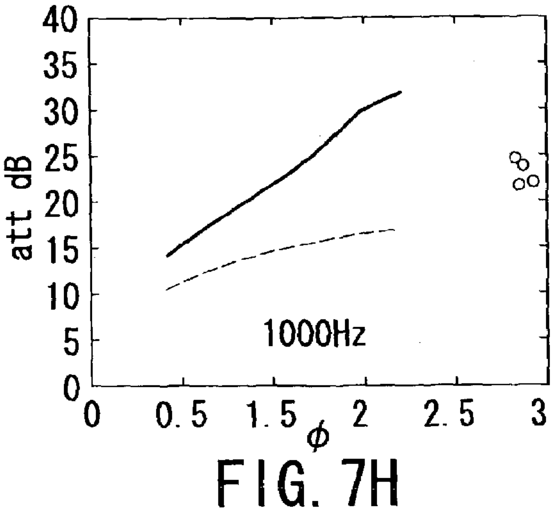

FIG. 5 is an illustration showing the sound reduction achieved by active noise control. The horizontal axis and the vertical axis respectively represent the Fresnel number ø and the noise reduction (dB) at the sound receiving point. Note that the Fresnel number ø is expressed as follows.

$$\phi = \frac{(L_a + L_b + V_a + V_b)}{\lambda/2} \tag{12}$$

In FIG. 5, the broken line indicates the reduction (ANC OFF) achieved before the control only by means of the sound insulating wall S. On the other hand, the solid line indicates the reduction (ANC ON) achieved after the control. Thus the relative reduction τ expressed by the difference between the broken line and the solid line is attributable to the active noise control of the embodiment of the present invention.

If, for example, Va=2.5 m and Vb=3 m, the horizontal axis Ø=0.7 corresponds to the height h=1 m of the sound insulating wall S and the noise reduction achieved by the active noise control is about 5 dB. In other words, the sound insulating wall S has to be made taller by 1 m in order to achieve a comparable effect without using the active noise control.

Assume that the sound insulating wall S has a height of h=2. Then, the sound insulating wall S has to be made taller by 4 m in order to achieve a comparable effect without using the active noise control. Differently stated, the greater the value of the horizontal axis Ø, the greater the effect of the active noise control relative to the sound insulating wall S if compared with a vertical extension of the sound insulating wall. In other words, the use of this embodiment produces an effect similar to a vertical extension of the wall and hence noises can be reduced without requiring any vertical extension of the sound insulating wall S.

An experiment was conducted to prove the above results. The positional relationships among the noise source T, the sound insulating wall S, the control loudspeaker 13 and the control microphone 11 were such that La=2.5 m, h=1 m, re=0.3 m, θe=1.1θx and the noise source T was made to radiate a random noise. The reduction in sound pressure was observed before and after moving the sound receiving point X to establish Lb=2 m, 3 m, 4 m and 5 m. The noise frequency was analyzed for ⅓ octave between 200 Hz and 1 kHz. FIGS. 6A through 6D schematically illustrate the results obtained for noise reduction at the above cited different positions of the sound receiving point X and FIGS. 7A through 7H are schematic illustrations of the results obtained for noise reduction in terms of different frequencies of noise. In each of FIGS. 6A through 6D and 7A through 7H, the solid line indicates the theoretical values obtained by active noise control and the broken line indicates the theoretical values obtained without active noise control, whereas the small circles indicates the values obtained in the experiment.

As for frequency, while the sound muffling effect of the embodiment obtained in the experiment was low if compared with the theoretically calculated effect in a medium frequency zone not lower than 500 Hz, it was higher than the theoretical effect obtained without active noise control as indicated by the broken line in each and every graph to prove the effectiveness of the embodiment.

Figure 8:
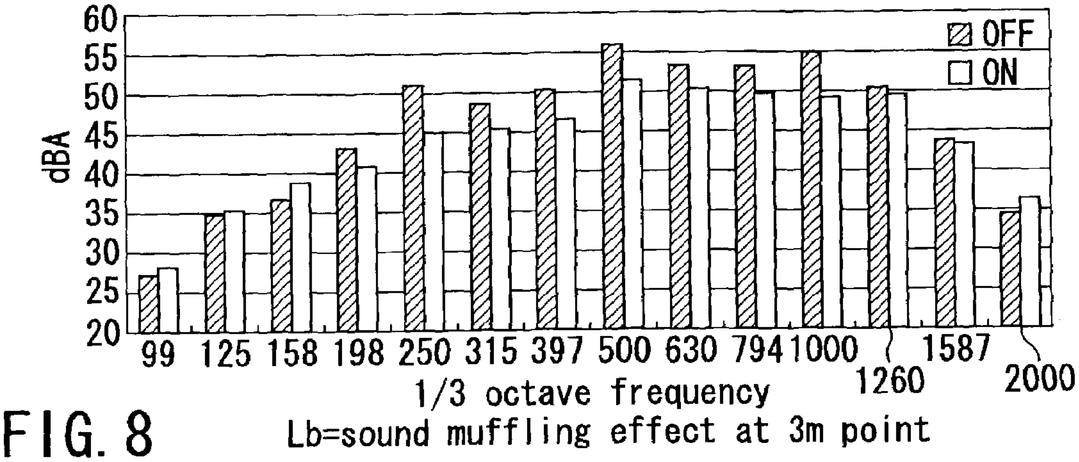
FIG. 8 is an illustration showing the sound muffling effect for each selected frequency as observed before and after an active noise control.

FIG. 8 shows the results that are obtained in the experiment and provide the basis for the graphs in FIGS. 6A through 6D and 7A through 7H. More specifically, the sound muffling effect of the embodiment was observed by gauging the sound pressure for each of the selected frequencies before and after active noise control. The effectiveness of the embodiment was proved by the experiment when the noise source T is a line sound source.

Figure 9:
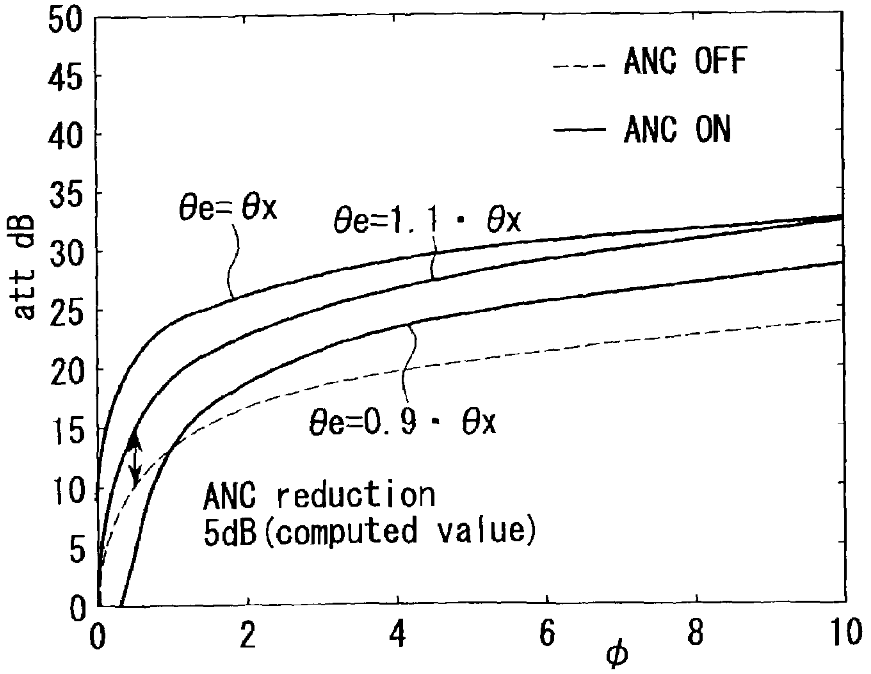
FIG. 9 is an illustration showing the sound reduction of a control microphone that varies as a function of the angle from the top end of the sound insulating wall.

Now, an arrangement that can improve the sound muffling effect of the system configuration of FIG. 4 will be discussed based on the above described numerical analysis. FIG. 9 is a graph of noise reduction that can be achieved when the angle θe between the sound insulating wall S and the control microphone 11 at the top end of the sound insulating wall S is varied within a range between 0.9 θx and 1.1 θx. Other parameters include La=2.5λ, Lb=3λ, a frequency of 350 Hz, h=1λ, re=0.3λ and hs=0.1λ. In this case, the noise reduction was equal to 5 dB when Ø=0.7 and θe=1.1θ.

As clearly seen from FIG. 9, the noise reduction effect is most remarkable when the control microphone 11 is arranged on the straight line connecting the top end of the sound insulating wall S and the sound receiving point X from the viewpoint of selection of angle θe for the control microphone 11. The effect is more remarkable when the control microphone 11 is placed below the straight line than when it is placed above the straight line.

Figure 10:
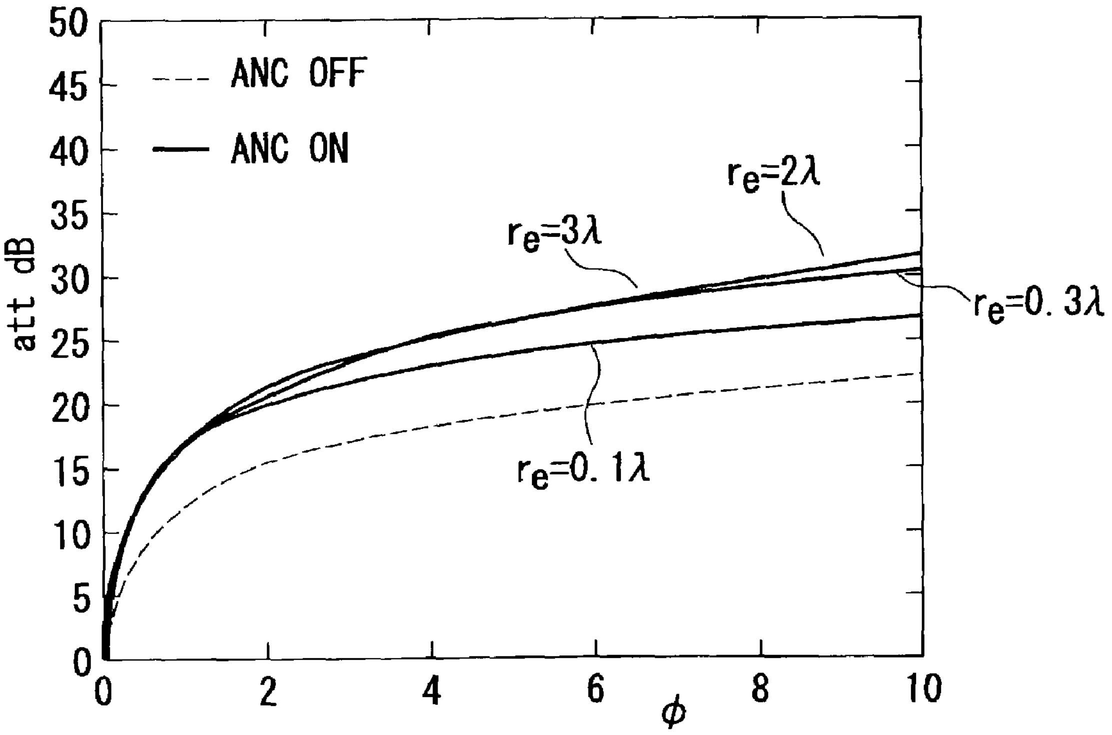
FIG. 10 is an illustration showing the sound reduction of a control microphone that varies as a function of the distance from the top end of the sound insulating wall.

FIG. 10 is a schematic illustration of the noise reduction effect of the control microphone 11 that varies as a function of the distance re from the top end of the sound insulating wall S to the control microphone 11 when the distance is varied within a range between 0.1 and 3λ (λ: wavelength). Other parameters include La=2.5λ, Lb=3λ, a frequency of 350 Hz, h=1λ and hs=0.1λ.

As clearly seen from FIG. 10, the noise reduction effect is more remarkable when the control microphone 11 is placed close to the sound receiving point Xe from the viewpoint of the distance re between the top end of the sound insulating wall S to the control microphone 11. However, the effect changes depending on the Ø value of the horizontal axis and does not change significantly when Ø<2 so that it is not degraded if the control microphone 11 is arranged close to the top end of the sound insulating wall S.

Figure 11:
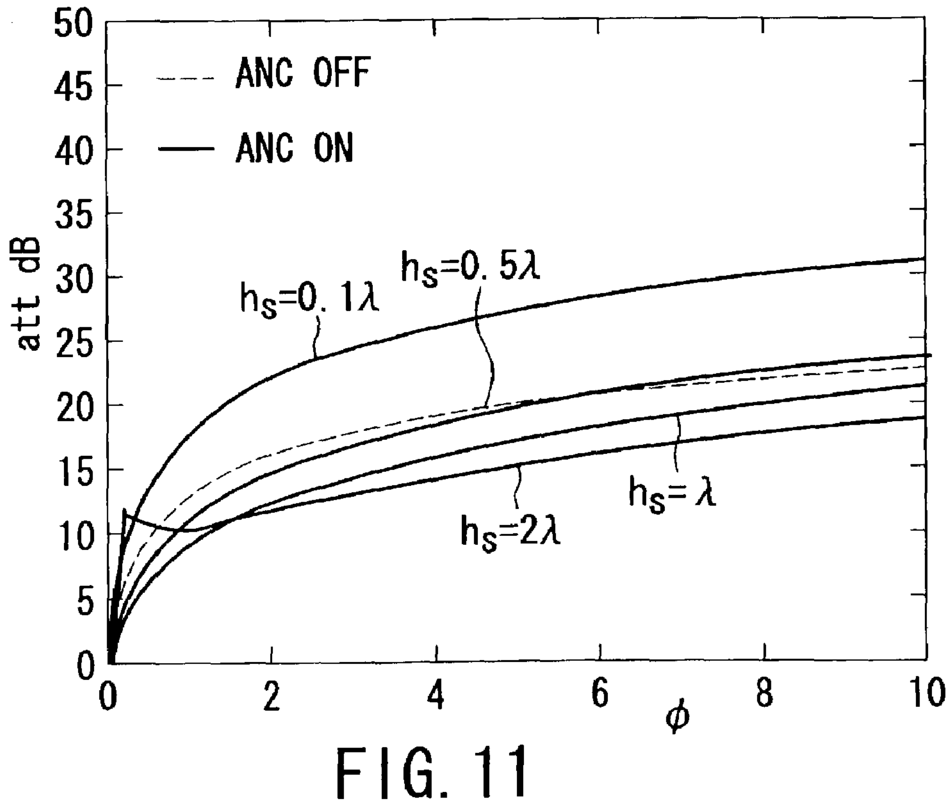
FIG. 11 is an illustration showing the sound reduction of a control loudspeaker that varies as a function of the distance from the top end of the sound insulating wall.

FIG. 11 is a schematic illustration of the noise reduction effect of the control loudspeaker 13 that varies as a function of the height of the control loudspeaker 13 from the top end of the sound insulating wall S when the distance is varied within a range between 0.1 and 2λ. Other parameters include La=2.5λ, Lb=3λ, a frequency of 350 Hz and h=1λ.

As clearly seen from FIG. 11, the noise reduction effect is remarkable when the control loudspeaker 13 is placed as close as possible relative to the top end of the sound insulating wall S from the viewpoint of the height of the control loudspeaker 13 from the top end of the sound insulating wall S. The noise increases when the height hs is greater than the half wavelength (0.5λ).

From the results illustrated in FIGS. 9 through 11, it will be seen that the control loudspeaker 13 and the control microphone 11 that are arranged close to each other are disposed at the top end of the sound insulating wall S when Ø<2.

Now, an optimum arrangement of the control microphone 11 will be discussed from the viewpoint of making the control sound generated by the control loudspeaker 13 show a phase opposite to and an amplitude equal to the phase and the amplitude of the diffracted energy E respectively. As pointed out above, it is necessary to discuss both the case where the noise source T is a point sound source and the case where it is a line sound source. Additionally, since the characteristic of the noise source T that is a line sound source varies as a function of the distance from the control loudspeaker 11, the differences of the characteristic among the space regions R1 through R3 shown in FIG. 2B will also be discussed.

Firstly, assume that the control microphone 11 is located in the space region R1 that is separated from the oscillation surface of the loudspeaker by less than Lb/π(m). In the space region R1, the radiation characteristic of sound is that of a surface sound source in the moving direction of sound. In other words, the sound propagates as plane wave that is free from distance attenuation. Therefore, when the control microphone 11 is located within the space region R1, the sound pressure P detected by the control microphone 11 is expressed by the equation below:

$$P=Qp\cdot Zp+Qs\cdot Zs \qquad (13),$$

Where Qp is the intensity of the diffracted sound (=volume velocity), Zp is the space propagation characteristic from the position of the diffracted energy E to the control microphone 11, Qs is the intensity of the sound emitted from the control loudspeaker 13 (=volume velocity) and Zs is the space propagation characteristic from the control loudspeaker 13 to the control microphone 11.

If the air density is ρ, the purely imaginary number is j and the angular frequency is ω, while the number of waves is k (k=ω/c, c: sound velocity) and the distance from the control loudspeaker 13 to the control microphone 11 is Ls, the space propagation characteristic Zs is expressed by the equation below.

$$Zs=\rho j\omega\cdot e^{-jkLs} \quad (14)$$

Note that the distance is measured with reference to the center position of the control loudspeaker 13.

If the sound pressure level of the control microphone 11 is made lowest by means of the control circuit 12, the right side of the equation (14) comes close to nil. Therefore, the intensity Qs of the sound emitted from the control loudspeaker 13 is expressed as follows.

$$Q_S=-\frac{Z_P}{Z_S}\cdot Q_P \quad (15)$$

When the noise source T is a single point sound source, the space propagation characteristic Zp from the position of the diffracted energy E to the control microphone 11 of the equation (15) can be expressed in terms of the distance Lp from the position where the diffracted energy generated along the longitudinal direction of the top end of the sound insulating wall S, or the point where the sound is most intense, to the control microphone 11 as follows.

$$Z_P=\frac{\rho j\omega}{4\pi L_P}e^{-jkL_P} \quad (16)$$

Note that the distance is measured with reference to the center position of the control microphone 11.

Now, take a model where N point sound sources (the intensity of sound of each point sound source=Qp/N) are arranged horizontally in a row for a noise source T that is a line sound source. Then, the space propagation characteristic Zpi from the i-th point sound source to the control microphone 11 is as follows.

$$Z_{Pi}=\frac{\rho j\omega}{4\pi L_{Pi}}e^{-jkL_{Pi}} \quad (17)$$

Therefore, when the noise source T is a point sound source, the intensity of sound of the control loudspeaker 13 for the diffracted sound at the front end as shown in the equation (15) is expressed by the equation below.

$$Q_S=-\frac{1}{4\pi L_P}\cdot e^{-jk(L_P-L_S)}\cdot Q_P \quad (18)$$

On the other hand, when the noise source T is a line sound source, the equation below is applicable.

$$Q_S=-\frac{1}{N}\sum_{i=1}^{N}\frac{1}{4\pi L_{Pi}}\cdot e^{-jk(L_{Pi}-L_S)}\cdot Q_P \quad (19)$$

If low frequency noises are to be dealt with, the acoustic power falls when the intensity of sound of the control loudspeaker 13 is substantially same as that of the diffracted sound at the front end but the phase is inverted. Therefore, the diffracted sound can be reduced when the requirement of the equation (20) below is met.

$$Qs=-Qp \quad (20)$$

Thus, from the equation (18), when the noise source T is a point sound source, it is sufficient for the control microphone 11 to be placed at or near the position where the requirement of the equation (21) and that of the equation (22) below are met.

$$Lp=Ls \quad (21) \text{ and}$$

$$Lp=1/4\pi \quad (22)$$

When, on the other hand, the noise source T is a line sound source, it is sufficient for the control microphone 11 to be placed at or near the position where the requirement of the equation (23) and that of the equation (24) below are met because of the equation (19).

$$Lpi\cong Ls \quad (23)$$

$$\frac{1}{4\pi}\sum_{i=1}^{N}\frac{1}{L_{Pi}}=N \quad (24)$$

As pointed out above, take a model where N point sound sources are arranged horizontally in a row for a noise source T that is a line sound source. If the length of the line sound source is du, the value of N is determined by determining how many waves of a wavelength equal to a quarter of the wavelength of the sound from the noise source can be placed in the length. If, for example, du=2(m) and the frequency of the sound from the noise source is 100 Hz, 2.3 waves of the wavelength that is equal to a quarter of the wavelength of the sound can be placed in that length. Therefore, N=3 in this example. When expressed by a formula, N is the smallest integer that satisfies the requirement of the formula below.

$N\geqq(4\cdot du)/\lambda$ (where $\lambda=c/f$:wavelength=sound velocity/frequency)

The position of the center of N point sound sources is defined to be the center of the corresponding line sound source that is equally divided by N (du/N).

Now, a situation where the control microphone 11 is located in the space region R2 that is separated from the oscillation surface of the loudspeaker by a distance not less than Lb/π(m) and less than La/π(m) will be discussed below. In the space region R2, a sound is propagated with a distance attenuation characteristic that is specific to a line sound source as viewed in the moving direction of the sound. Therefore, take a model showing an acoustic characteristic of M point sound sources (the intensity of sound of each point sound source=Qs/M) arranged horizontally in a row. Then, the space propagation characteristic Zsi from the i-th point sound source to the control microphone 11 is as follows.

$$z_{Si} = \frac{\rho j\omega}{4\pi L_{Si}} e^{-jkL_{Si}} \tag{25}$$

The positions of the M point sound sources are determined in a manner as described above. Therefore, when the noise source T is a point sound source, the intensity of sound of the control loudspeaker 13 for the diffracted sound at the front end that is obtained by the active noise control is expressed by the equation below.

$$Q_S = \frac{\frac{1}{L_P}}{\frac{1}{M}\sum_{i=1}^{M}\frac{1}{L_{Si}}\cdot e^{-jk(L_{Si}-L_P)}} Q_P \tag{26}$$

On the other hand, when the noise source T is a line sound source, the equation below is applicable.

$$Q_S = -\frac{\frac{1}{N}\sum_{i=1}^{N}\frac{1}{L_{Pi}}\cdot e^{-jkL_{Pi}}}{\frac{1}{M}\sum_{i=1}^{M}\frac{1}{L_{Si}}\cdot e^{-jkL_{Si}}} Q_P \tag{27}$$

Therefore, when the noise source T is a point sound source, the position of the control microphone 11 that satisfies the requirement of the equation (20) is found at or near the position that meets the requirements shown below.

$$L_p \cong Lsi \qquad \frac{1}{M}\sum_{i=1}^{M}\frac{1}{L_{Si}} = \frac{1}{L_P} \tag{28}$$

When, on the other hand, the noise source T is a line sound source, the position is found at or near the position that meets the requirements shown below.

$$L_{pi} \cong Lsi \qquad \frac{1}{M}\sum_{i=1}^{M}\frac{1}{L_{Si}} = \frac{1}{N}\sum_{i=1}^{N}\frac{1}{L_{Pi}} \tag{29}$$

Strictly speaking, the N or M point sound sources have a certain horizontal length and the control microphone is not separated from the group of line sound sources by more than tens of several meters and hence the distances Lpi (i=1, 2, . . . , N) or Lsi (i=1, 2, . . . , M) from the point sound sources to the control microphone do not necessarily agree with each other (Lp1≠Lp2≠Lp3≠ . . . , LS1≠Ls2≠Ls3≠ . . . ). Therefore, if the noise source T is a point sound source, Lp=Lsi does not hold true for all the point sound sources. Lpi=Lsi does not hold true either for the noise source T that is a line sound source.

However, since the frequency that active noise control deals with is a low frequency between tens of several Hz to 200 Hz, phase discrepancies that correspond to the differences of distance among Lpi and Lsi are within the tolerance region for minimizing the acoustic power in view of the long wavelength.

Therefore, it is possible to generate an optimum amplitude when the requirements of (28) and (29) are met. Then, the intensity of sound Qs (the sum of the intensities of sound of M sound sources) of the additional sound source is substantially equal to the intensity of sound Qp (the sum of the intensities of sound of N sound sources in the case of a line sound source) so that consequently it is possible to reduce the acoustic power by controlling and minimizing the sound pressure detected by the control microphone regardless if the noise source T is a point sound source or a line sound source.

Finally, a situation where the control microphone 11 is located in the space region R3 that is separated from the oscillation surface of the loudspeaker by a distance not less than La/π(m) will be discussed below. In the space region R3, a sound is propagated with a distance attenuation characteristic that is specific to a point sound source as viewed in the moving direction of the sound. Note that the distance is measured with reference to the center position of the control loudspeaker 13. Therefore, the space propagation characteristic Zs from the control loudspeaker 13 to the control microphone 11 is expressed by the equation below.

$$z_S = \frac{\rho j\omega}{4\pi L_S} e^{-jkL_{Si}} \tag{30}$$

Thus, when the noise source T is a point sound source, the intensity of sound of the control loudspeaker 13 relative to the diffracted sound at the front end as obtained by the active noise control is expressed by the equation below.

$$Q_S = -\frac{L_S}{L_P}\cdot e^{-jk(L_P-L_S)}\cdot Q_P \tag{31}$$

When the noise source T is a line sound source, the intensity of sound is expressed by the equation below.

$$Q_S = -\frac{\frac{1}{N}\sum_{i=1}^{N}\frac{1}{L_{Pi}}\cdot e^{-jk(L_{Pi}-L_S)}}{\frac{1}{L_S}} Q_P \tag{32}$$

Therefore, when the noise source T is a point sound source, the position of the control microphone 11 that satisfies the requirement of the equation (30) is located at or near the position that satisfies the requirement of $$Lp=Ls \tag{33}$$

When, on the other hand, the noise source T is a line sound source, the position of the control microphone 11 that satisfies the requirement of the equation (30) is located at or near the position that satisfies the requirements of $$Lpi \cong Ls \tag{34}$$

$$\frac{1}{N}\sum_{i=1}^{N}\frac{1}{L_{Pi}}=\frac{1}{L_S}$$

Therefore, it is possible to generate an optimum amplitude when the requirements of (33) and (34) are met. Then, the intensity of sound Qs (the sum of the intensities of sound of M sound sources) of the additional sound source is substantially equal to the intensity of sound Qp (the sum of the intensities of sound of N sound sources in the case of a line sound source) so that consequently it is possible to reduce the acoustic power by controlling and minimizing the sound pressure detected by the control microphone regardless if the noise source T is a point sound source or a line sound source.

As described above, with the first embodiment of active sound muffler 10, it is possible to reduce and minimize the diffraction energy in the entire surroundings with a limited number of control microphones 11, taking all the diffraction energy E at the front end of the sound insulating wall S into consideration, arranging optimally the control microphones 11 and detecting noises from the sound insulating wall S even when the noises are out of phase.

Figure 12:
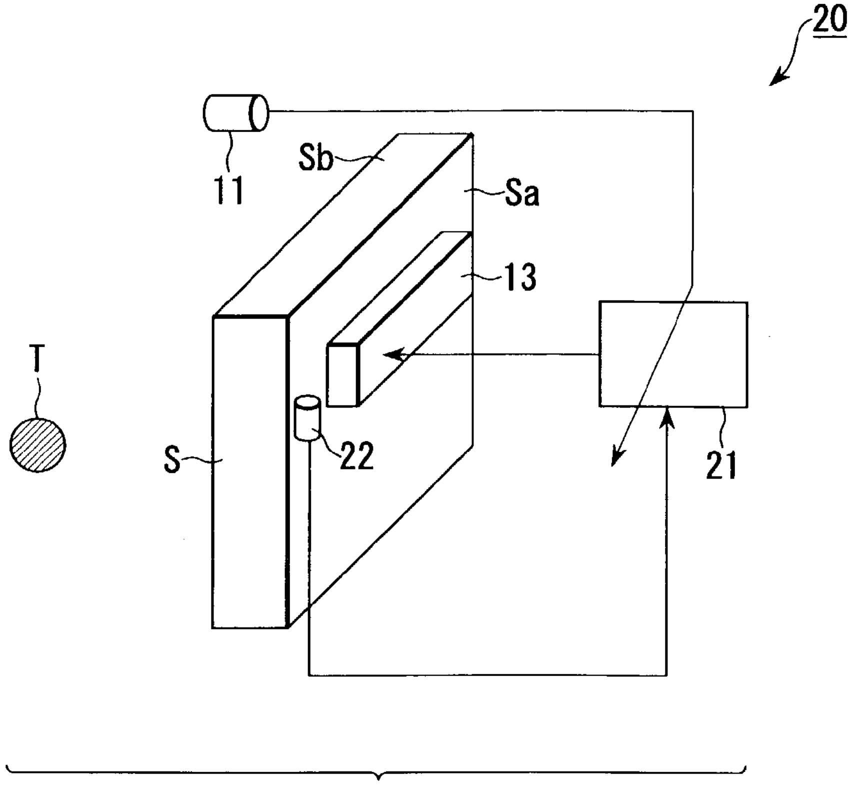
FIG. 12 is an illustration showing the configuration of the second embodiment of active sound muffler according to the invention.

FIG. 12 is a schematic illustration of the configuration of active sound muffler 20 according to the second embodiment of the invention. In FIG. 12, the components that are same as those of FIG. 1 are denoted respectively by the same reference symbols and will not be described any further.

The active sound muffler 20 comprises a control microphone (sound source gauging device) 11 arranged above the sound insulating wall S at a given position, which will be described hereinafter, in order to detect the sound pressure or the acoustic intensity of diffracted sound, a control circuit 21 for generating a sound with a phase inverse to that of the diffracted sound from a control loudspeaker 13, which will be described hereinafter, in order to minimize the signal detected by the control microphone 11 based on the output of the control microphone 11, the control loudspeaker (additional sound source) 13 fitted near the top end Sa of the side where sounds are to be muffled of the sound insulating wall S and a reference signal detecting microphone 22 arranged near the control loudspeaker 13. The operation of driving the control loudspeaker is controlled by the control circuit 21.

The reference signal detecting microphone 22 is arranged near the control loudspeaker 13 for the following reason. Unlike cyclic sounds such as electromagnetic noises of transformers and noises of generators, noises to be dealt with are random sounds. Since cyclic sounds have a same and uniform amplitude that is sustained, a sound that is correlated with the sound detected by way of the reference signal can get to the loudspeaker. On the other hand, a random sound is temporary and the random sound detected by way of the reference signal does not necessarily get to the loudspeaker. Then, it may not be possible to muffle a random sound by producing a sound having a phase inverse to that of the detected random sound and emitting it from a loudspeaker. Therefore, the reference signal detecting microphone is preferably arranged at a position close to the loudspeaker. Since the loudspeaker is a line sound source and the sound emitted from it is directional so that a howling phenomenon can hardly occur between the reference signal detecting microphone and the loudspeaker.

The control circuit 21 is adapted to feed forward control based on the output of the reference signal detecting microphone 22.

With the above described arrangement, the control loudspeaker 13 that is a line sound source shows a sharp directivity to the opposite lateral sides and hence the control sound is attenuated rapidly. Therefore, if the reference signal detecting microphone 22 for generating a sound by way of the control loudspeaker 13 is arranged at this position, the sound from the control microphone 11 can hardly be overlapped and the microphone 22 and the loudspeaker 13 do not form a closed loop so that a howling phenomenon can hardly occur.

If the above statement does not hold true, the reference signal detecting microphone 22 has to be moved away from the control loudspeaker 13 in order to avoid a howling phenomenon. However, since noises that the sound insulating wall S needs to deal with are random sounds, the coherence (control responsiveness) of the signal detected by the reference signal detecting microphone 22 and the sound field signal at or near the control loudspeaker 13 can be degraded to make it difficult to realize a satisfactory control if the microphone 22 and the loudspeaker 13 are separated by an undesirable long distance.

As described above, the second embodiment of active sound muffler 20 provides advantages similar to those of the first embodiment of active sound muffler 10 and additionally it can realize a satisfactory control by way of feed forward control using the reference signal detecting microphone 22 and at the same time prevent howling and degradation of coherence from taking place.

Figure 13:
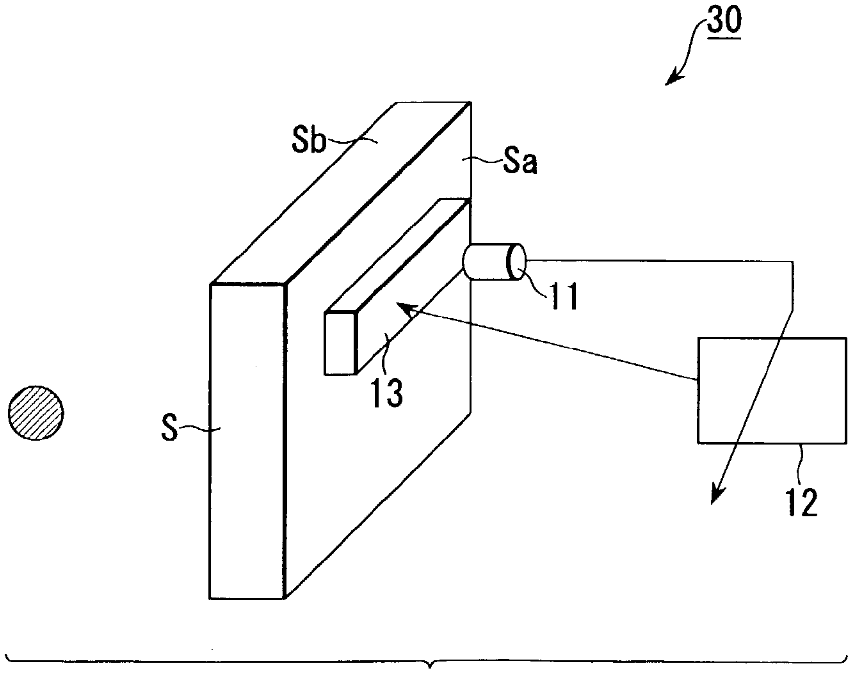
FIG. 13 is an illustration showing the configuration of the third embodiment of active sound muffler according to the invention.

FIG. 13 is a schematic illustration of the configuration of active sound muffler 30 according to the third embodiment of the invention. In FIG. 13, the components that are same as those of FIG. 1 are denoted respectively by the same reference symbols and will not be described any further.

The active sound muffler 30 comprises a control microphone (sound source gauging device) 11 arranged in front of the control loudspeaker 13 of the sound insulating wall S at a given position, which will be described hereinafter, in order to detect the sound pressure or the acoustic intensity of diffracted sound, a control circuit 12 for generating a sound with a phase inverse to that of the diffracted sound from a control loudspeaker 13, which will be described hereinafter, in order to minimize the signal detected by the control microphone 11 based on the output of the control microphone 11 and the control loudspeaker (additional sound source) 13 fitted to the lateral surface Sa of the side where sounds are to be muffled of the sound insulating wall S. The operation of driving the control loudspeaker is controlled by the control circuit 12. The control loudspeaker 13 may alternatively be fitted to the top surface Sb of the sound insulating wall S.

A control sound from the control loudspeaker 13 is input to the control microphone 11. The relationship between the control microphone 11 and the space regions R1 through R3 is same as the one described above with reference to the active sound muffler 10.

In the active sound muffler 30 having the above described configuration is adapted to minimize the sound pressure or the acoustic intensity of the control sound from the control loudspeaker 13 as detected by the control microphone 11 arranged near the acoustic radiation surface of the control loudspeaker 13. Therefore, since a sound showing a phase inverse to that of the diffracted sound is generated from the control loudspeaker 13 and the control loudspeaker 13 is located near the diffraction energy E, the diffraction energy E of the sound insulating wall S can be minimized to reduce the diffracted sound propagating to the side where sounds are to be muffled in the entire space.

The third embodiment of active sound muffler 30 provides advantages similar to those of the first embodiment of active sound muffler 10.

The present invention is by no means limited to the above described embodiments. While sounds to be muffled by any of the above described embodiments are road noises. The present invention is not limited thereto and can be applied to construction sites, the walls of athletic fields and so on. The above described embodiments may be modified in various different ways without departing from the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An active sound muffler for reducing a sound to be reduced as emitted from a sound source located at one of opposite sides of a sound insulating wall and diffracted by a top end of the sound insulating wall and transmitted to the other side, the muffler comprising:

an additional sound source arranged at the top end or the other side of the sound insulating wall and adapted to output a control sound with a predetermined amplitude and a predetermined phase;

a sound source gauging device arranged on a straight line connecting the top end of the sound insulating wall and a sound receiving point to be located at the other side and receive the diffracted sound, and adapted to gauge a sound pressure or an acoustic intensity of the sound to be reduced and that of the control sound; and an additional sound source controller configured to control the output of the additional sound source so as to minimize a sound pressure or an acoustic intensity of the sound to be reduced at the sound receiving point, whichever appropriate, based on the outcome of gauging of the sound source gauging device, wherein the additional sound source shows a line sound source characteristic and wherein the sound pressure detected by the sound source gauging device is expressed by the equation $$P=Q_p*Z_p+Q_s*Z_s,$$

where P is the sound pressure, $Q_p$ is an intensity of the diffracted sound, $Z_p$ is a space propagation characteristic from a position of a diffracted energy to the sound source gauging device, $Q_s$ is an intensity of sound emitted from the additional sound source and $Z_s$ is a space propagation characteristic from the additional sound source to the sound source gauging device, wherein $Zs=pj\omega\cdot e^{-jkLs}$, where p is the air density, j is the purely imaginary number, ω is the angular frequency, and the number of waves is k (k=ω/c, c: sound velocity).

2. The active sound muffler according to claim 1, wherein a reference signal detecting microphone is arranged near the additional sound source; and the additional sound source controller is configured to perform a feed forward control operation based on an output of the reference signal detecting microphone.

3. The active sound muffler according to claim 1, wherein the sound source gauging device is arranged near the sound receiving point to be located at the other side.

4. The active sound muffler according to claim 1, wherein the additional sound source is separated from the top end of the sound insulating wall by a distance less than a half of a wavelength of the sound to be reduced.

5. An active sound muffler for reducing a sound to be reduced as emitted from a sound source located at one of opposite sides of a sound insulating wall and diffracted by a top end of the sound insulating wall and transmitted to the other side, the muffler comprising:

an additional sound source arranged at top end or the other side of the sound insulating wall and adapted to output a control sound with a predetermined amplitude and a predetermined phase;

a sound source gauging device arranged near an acoustic radiation surface of the additional sound source and on a straight line connecting the top end of the sound insulating wall and a sound receiving point to be located at the other side and receive the diffracted sound, and adapted to gauge a sound pressure or an acoustic intensity of the control sound; and an additional sound source controller configured to control the output of the additional sound source so as to minimize a sound pressure or an acoustic intensity of the sound to be reduced at the sound receiving point, whichever appropriate, based on an outcome of gauging of the sound source gauging device, wherein the additional sound source shows a line sound source characteristic and wherein the sound pressure detected by the sound source gauging device is expressed by the equation $$P=Q_p*Z_p+Q_s*Z_s,$$

where P is the sound pressure, $Q_p$ is an intensity of the diffracted sound, $Z_p$ is a space propagation characteristic from a position of a diffracted energy to the sound source gauging device, $Q_s$ is an intensity of sound emitted from the additional sound source and $Z_s$ is a space propagation characteristic from the additional sound source to the sound source gauging device, wherein $Zs=pj\omega\cdot e^{-jkLs}$, where p is the air density, j is the purely imaginary number, ω is the angular frequency, and the number of waves is k (k=ω/c, c: sound velocity).

6. The active sound muffler according to claim 5, wherein a reference signal detecting microphone is arranged near the additional sound source; and the additional sound source controller is configured to perform a feed forward control based on a output of the reference signal detecting microphone.

7. The active sound muffler according to claim 5, wherein the sound source gauging device is arranged near the sound receiving point to be located at the other side.

8. The active sound muffler according to claim 5, wherein the additional sound source is separated from the top end of the sound insulating wall by a distance less than a half of a wavelength of the sound to be reduced.

9. An active sound muffling method for reducing a sound to be reduced as emitted from a sound source located at one of opposite sides of a sound insulating wall and diffracted by a top end of the sound insulating wall and transmitted to the other side, the muffling method comprising:

a control sound outputting step of outputting a control sound from an additional sound source arranged at top end or the other side of the sound insulating wall with a predetermined amplitude and a predetermined phase;

a sound source gauging step of gauging a sound pressure or an acoustic intensity of the sound to be reduced and that of the control sound at a position above the sound insulating wall and on a straight line connecting the top end of the sound insulating wall and a sound receiving point to be located at the other side and receive the diffracted sound; and an additional sound source controlling step of controlling the output of the control sound so as to minimize a sound pressure or an acoustic intensity of the sound to be reduced at the sound receiving point, whichever appropriate, based on an outcome of gauging in the sound source gauging step, wherein the control sound shows a line sound source characteristic and wherein the sound pressure detected by the sound source gauging device is expressed by the equation $$P=Q_p*Z_p+Q_s*Z_s,$$

where P is the sound pressure, $Q_p$ is an intensity of the diffracted sound, $Z_p$ is a space propagation characteristic from a position of a diffracted energy to the sound source gauging device, $Q_s$ is an intensity of sound emitted from the additional sound source and $Z_s$ is a space propagation characteristic from the additional sound source to the sound source gauging device, wherein $Zs=pj\omega\cdot e^{-jkLs}$, where p is the air density, j is the purely imaginary number, ω is the angular frequency, and the number of waves is k (k=ω/c, c: sound velocity).

10. The active sound muffling method according to claim 9, wherein the additional sound source controlling step includes:

a reference signal detecting step of gauging a sound pressure or an acoustic intensity of the sound to be reduced and that of the control sound at a position near the additional sound source; and a feed forward control step of performing a feed forward control based on an outcome of gauging in the reference signal detecting step.

11. An active sound muffling method for reducing a sound to be reduced as emitted from a sound source located at one of opposite sides of a sound insulating wall and diffracted by a top end of the sound insulating wall and transmitted to the other side, the muffling method comprising:

a control sound outputting step of outputting a control sound from an additional sound source arranged at the top end or the other side of the sound insulating wall with a predetermined amplitude and a predetermined phase;

a sound source gauging step of gauging a sound pressure or an acoustic intensity of the sound to be reduced and that of the control sound at a position near the acoustic radiation surface of the additional sound source and on a straight line connecting the top end of the sound insulating wall and a sound receiving point to be located at the other side and receive the diffracted sound; and an additional sound source controlling step of controlling the output of the control sound so as to minimize a sound pressure or an acoustic intensity of the sound to be reduced at the sound receiving point, whichever appropriate, based on an outcome of gauging in the sound source gauging step, wherein the control sound shows a line sound source characteristic and wherein the sound pressure detected by the sound source gauging device is expressed by the equation $$P=Q_p*Z_p+Q_s*Z_s,$$

where P is the sound pressure, $Q_p$ is an intensity of the diffracted sound, $Z_p$ is a space propagation characteristic from a position of a diffracted energy to the sound source gauging device, $Q_s$ is an intensity of sound emitted from the additional sound source and $Z_s$ is a space propagation characteristic from the additional sound source to the sound source gauging device, wherein $Zs=pj\omega\cdot e^{-jkLs}$, where p is the air density, j is the purely imaginary number, ω is the angular frequency, and the number of waves is k (k=ω/c, c: sound velocity).

12. The active sound muffling method according to claim 11, wherein the additional sound source controlling step includes:

a reference signal detecting step of gauging a sound pressure or an acoustic intensity of the sound to be reduced and that of the control sound at a position near the additional sound source; and a feed forward control step of performing a feed forward control based on an outcome of gauging in the reference signal detecting step.

* * * * *